United States Patent [19]
Womack

[11] Patent Number: 5,923,583
[45] Date of Patent: Jul. 13, 1999

[54] FERROMAGNETIC MEMORY BASED ON TORROIDAL ELEMENTS

[76] Inventor: Richard Womack, 9521 Academy Hills Dr., NE., Albuquerque, N.M. 87111

[21] Appl. No.: 08/956,405

[22] Filed: Oct. 23, 1997

[51] Int. Cl.$^6$ .................................................. G11C 13/00
[52] U.S. Cl. ............................................ 365/171; 365/92
[58] Field of Search ................................... 365/171, 173, 365/84, 92

[56] References Cited

U.S. PATENT DOCUMENTS 4,903,343  2/1990  Cope et al. ................................. 365/92

Primary Examiner—Terrell W. Fears
Attorney, Agent, or Firm—Calvin B. Ward

[57] ABSTRACT

A magnetic memory cell for storing binary encoded data and a memory constructed from these memory cells. The memory cell stores information in the direction of magnetization of a torroidal layer of magnetic material. The memory cell is constructed from a structure having a top electrode, a soft layer which includes a planar sheet of a soft magnetic material, a hard layer which includes a planar sheet of a hard magnetic material, and a bottom electrode, the soft and hard layers being sandwiched between the top and bottom electrodes. The various layers are torroids. The hard and soft materials are chosen such that the magnitude to the magnetic field needed to magnetize the hard magnetic material is greater than the magnitude of the magnetic field needed to magnetize the soft magnetic material. The memory cell also includes a write circuit that generates first and second magnetic fields. The first is generated by passing a current between the top and bottom electrodes of a memory cell in a direction that determines the data state to be written. The magnitudes of the first and second magnetic fields are less than that needed to magnetize the soft magnetic material. However, the magnitude of the vector sum of the first and second magnetic fields is greater than the magnetic field needed to magnetize the soft magnetic material but less than the magnetic field needed to magnetize the hard magnetic material.

17 Claims, 8 Drawing Sheets

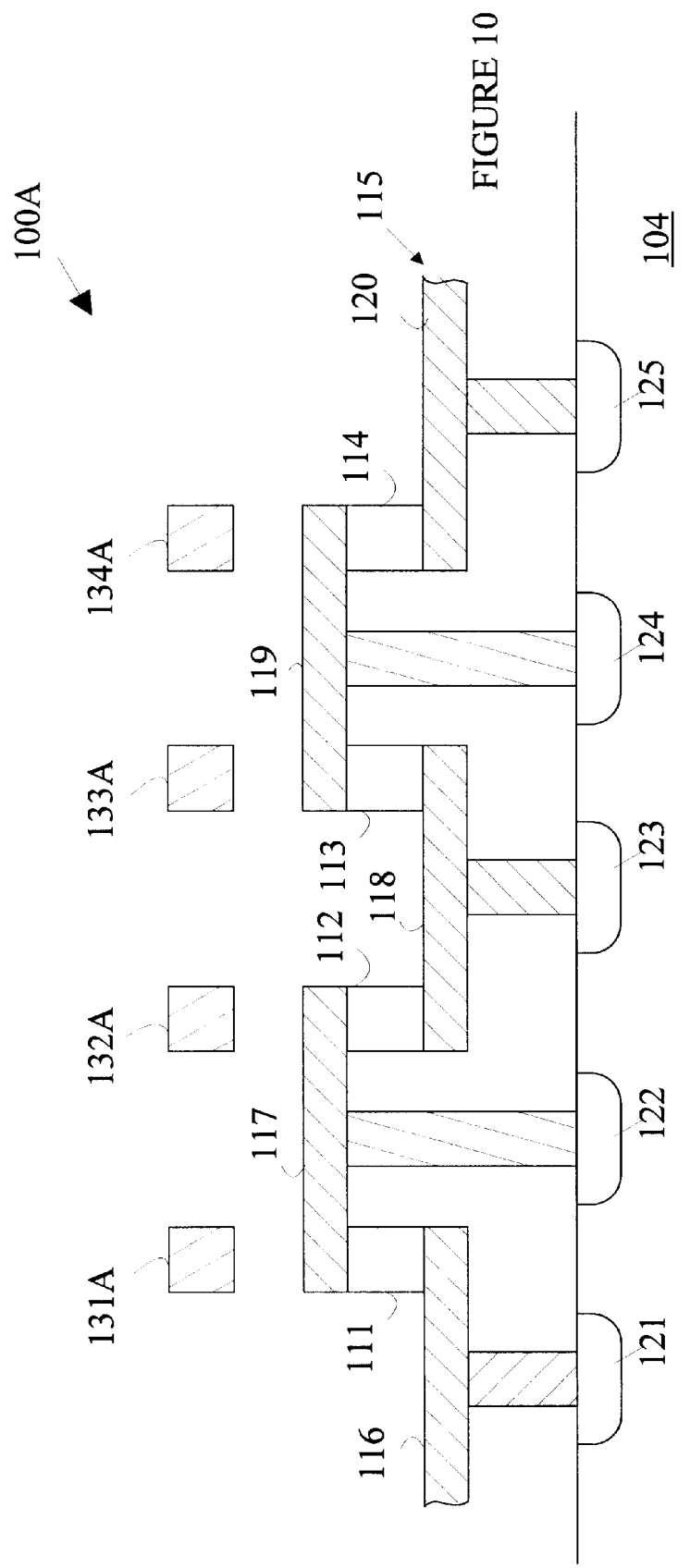

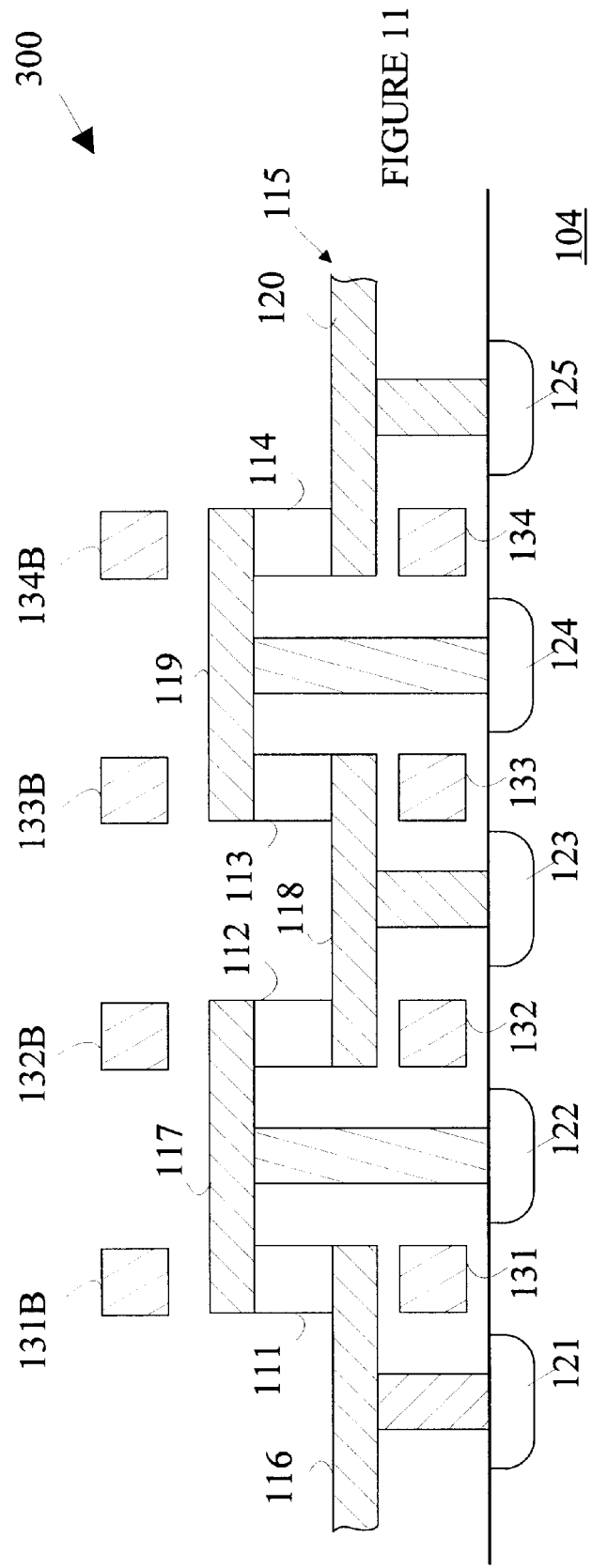

FERROMAGNETIC MEMORY BASED ON TORROIDAL ELEMENTS

FIELD OF THE INVENTION

The present invention relates to memory systems for use with computers and the like, and more particularly, to a memory based on ferromagnetic memory cells.

BACKGROUND OF THE INVENTION

Memory cells based on ferromagnetic structures are known to the art. These cells are constructed from a three layered structure in which two ferromagnetic layers are separated by a conducting non-magnetic layer. The ferromagnetic layers have different degrees of "hardness". For the purposes of this discussion, the "hardness" of a ferromagnetic layer will be defined to be the magnetic field needed to change the direction of magnetization of the material, a "hard" layer requiring a greater magnetic field than a "soft" layer. Data is stored in one of the layers by magnetizing the layer, a "1" corresponding to one direction of magnetization, a "0" to the other direction of magnetization. The other layer is used as a "reference" layer. For the purposes of this discussion, it will be assumed that data is stored in the soft layer, and the hard layer is used as the reference layer. In this case, the reference layer is permanently magnetized in one direction, and a field less than that needed to switch the reference layer is applied to store data in the soft layer.

The data is read by measuring the current that flows through the structure when a potential is applied across the two ferromagnetic layers. If the data layer is magnetized in the same direction as the reference layer, the device displays a smaller resistance to current flow than the case in which the two layers have different directions of magnetization.

While the basic cell has been known for some time, useful memories based on these cells have not been practical. Conventional memory architectures in which the memory cells are isolated or connected from a bit line by a transistor cannot be used with ferromagnetic memory cells because the resistance of the memory cells is small compared to the resistance of a transistor in the conducting state. Hence, the changes in resistance of the memory cell are masked by the high resistance of the isolation transistor.

To write a memory cell, a magnetic field must be applied to that memory cell that is sufficient to switch the soft layer, but less than the field that switches the reference layer. In addition, neighboring cells must not be switched. This requires a system for generating a local magnetic field at each memory cell. Memory architectures used in conventional CMOS memories or ferroelectric-based memories do not provide a means for generating local magnetic fields. In addition, conventional memory architectures require transistors in series with the memory elements to isolate the memory elements from the lines used to write the data therein. These transistors limit the currents, and hence, the magnetic fields, that may be applied to the memory elements in a magnetic memory cell.

Broadly, it is the object of the present invention to provide a memory system based on ferromagnetic memory cells.

It is a further object of the present invention to provide a memory system that does not require each cell to be isolated or connected by a pass transistor.

These and other objects of the present invention will become apparent to those skilled in the art from the following detailed description of the invention and the accompanying drawings.

SUMMARY OF THE INVENTION

The present invention comprises a magnetic memory cell for storing binary encoded data and a memory constructed from these memory cells. The memory cell stores information in the direction of magnetization of a torroidal layer of magnetic material. The memory cell is constructed from a structure having a top electrode, a soft layer which includes a planar sheet of a soft magnetic material, a hard layer which includes a planar sheet of a hard magnetic material, and a bottom electrode, the soft and hard layers being sandwiched between the top and bottom electrodes. The various layers are torroids. The hard and soft materials are chosen such that the magnitude to the magnetic field needed to magnetize the hard magnetic material is greater than the magnitude of the magnetic field needed to magnetize the soft magnetic material. The memory cell also includes a write circuit that generates first and second magnetic fields. The first is generated by passing a current between the top and bottom electrodes of a memory cell in a direction that determines the data state to be written. The magnitudes of the first and second magnetic fields are less than that needed to magnetize the soft magnetic material. However, the magnitude of the vector sum of the first and second magnetic fields is greater than the magnetic field needed to magnetize the soft magnetic material but less than the magnetic field needed to magnetize the hard magnetic material.

The memory cells may be connected in a rectangular array having a plurality of rows and columns to provide a memory system. The memory cells in any given column are connected in series by connecting the top electrode of each memory cell to the bottom electrode of an adjacent memory cell at a node between the memory cells. The memory system also includes a plurality of switching circuits for connecting a node in any given column to a node in an adjacent column for the purpose of measuring the potential difference across each memory element.

BRIEF DESCRIPTION OF THE DRAWINGS

FIG. 10 is a cross-sectional view of a portion of a memory according to the present invention showing an-alternative placement of the write conductors.

FIG. 11 is a cross-sectional view of a portion of a memory according to the present invention showing another possible placement of the write conductors.

DETAILED DESCRIPTION OF THE INVENTION

Figure 1:
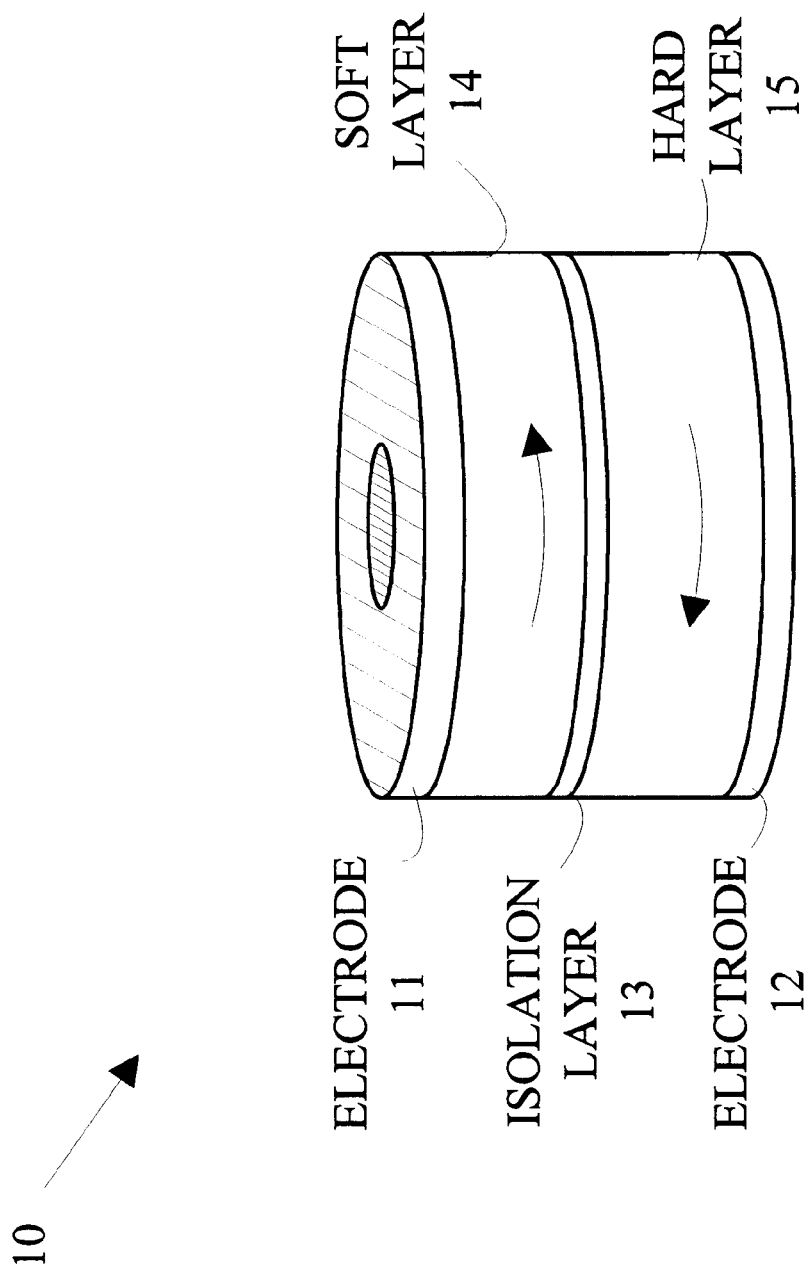
FIG. 1 is aerspective view of a magnetic memory cell according to the present invention.

The present invention is based on a magnetic memory cell of the general type shown in FIG. 1 at 10. Magnetic memory cell 10 is constructed from two layers of magnetic material, 14 and 15, which are sandwiched between a top electrode 11 and a bottom electrode 12. The two layers of magnetic material are isolated from one another by an isolation layer 13 which is constructed from a conducting material such as copper. The two magnetic layers have different degrees of hardness. The two magnetic layers are torroids. In the preferred embodiment of the present invention, the isolation layer is also torroidal. Torroids are particularly attractive as memory cells, since torroids exhibit two states of magnetization that are stable.

The magnetic materials used for the various layers are typically alloys. The degree of hardness of these alloys is determined by the materials in the alloy and their relative concentrations. For example, a NiFe alloy or a CoFe alloy may be used for the soft layer. The field needed to flip the magnetization of a CoFe alloy varies from 5 to 100 oe depending on the composition of the alloy. Hence, the hard layer may also be constructed from a CoFe alloy having different relative concentrations from that used for the soft layer.

The hard layer may be constructed from Cobalt or an alloy thereof, e.g. CoFe or NiCoFe. For example, NiCoFe alloys require fields between 50 and 200 oe to flip magnetization of the hard layer.

In the following discussion, it will be assumed that data is stored in memory cell 10 by changing the direction of magnetization of the soft layer 14. The hard layer 15 remains magnetized in the same direction. If the soft layer is magnetized in the same direction as the hard layer, the electrical resistance measured between electrodes 11 and 12 will be less than the resistance measured when the soft layer is magnetized in the opposite direction.

Isolation layer 13 reduces the coupling between the hard and soft layers. Ideally, the magnetic field needed to flip the magnetization of the soft layer between the two possible storage states should be the same independent of the starting state. However, the two layers are strongly coupled when placed in contact with one another. Without isolation layer 13, the magnetic field needed to switch the memory cell between states would be much greater if the starting state corresponded to the layers being magnetized in the opposite directions.

Figure 2:
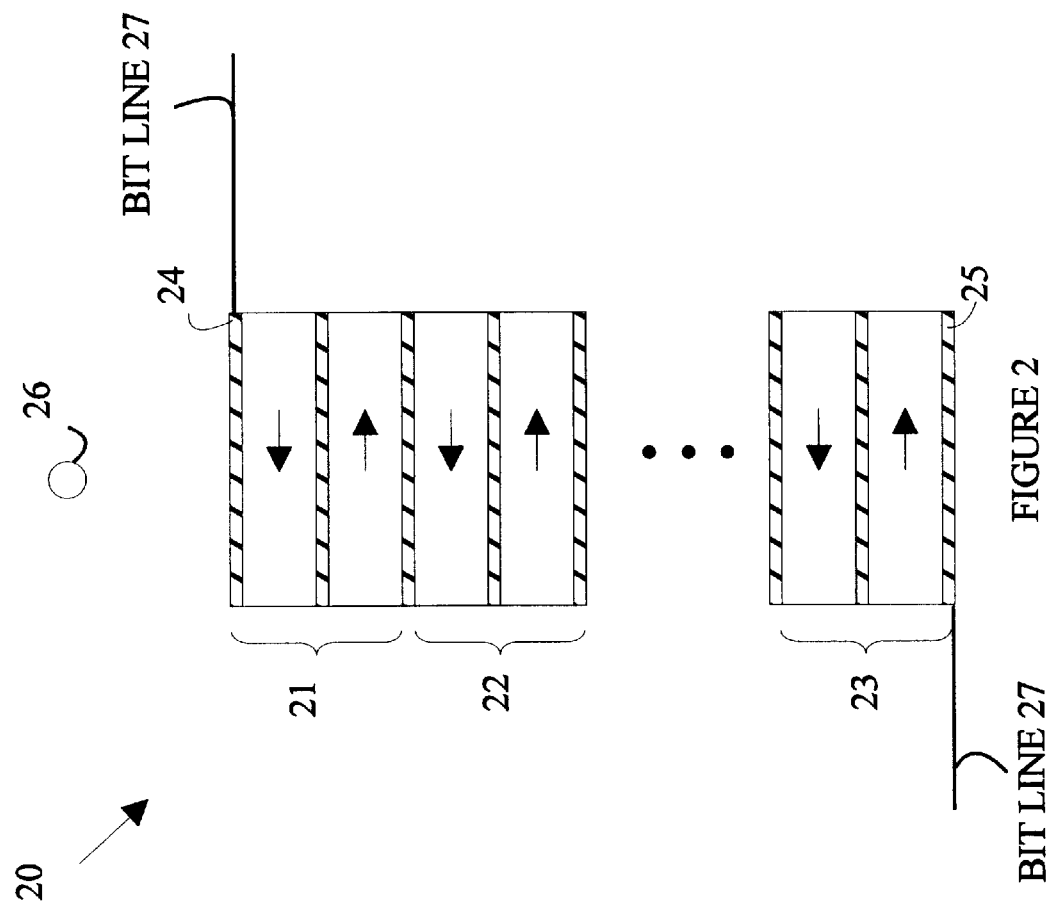
FIG. 2 is a cross-sectional view of a magnetic memory cell constructed from a plurality of three layered Sctures of the type shown in FIG. 1.

The change in resistance between the two storage states is relatively small. Hence, it is advantageous to combine a number of basic magnetic cells in series. Such a multi-cell structure is shown in FIG. 2 at 20. Exemplary magnetic cells are shown at 21–23. The resistance is measured between electrodes 24 and 25.

The limit on the number of basic magnetic cells that can be combined is determined by the manner in which the magnetic field used to write data into storage cell 20 is generated. To write data, a magnetic field sufficient to switch the soft layers in all of the basic cells must be applied to storage cell 20. This field must also be less than the magnetic field that would switch any of the hard layers in the basic cells. As will be explained in more detail below, the magnetic field is partially generated by a current flowing in a conductor such as wire 26 whose axis runs into and out of the plane of the figure. The magnetic field generated by such a conductor decreases linearly with the distance from the conductor. Hence, basic storage cell 23 will be subjected to a smaller field than basic storage cell 21. If the current is set such that the magnetic field at basic storage cell 21 is just below the field that would switch the hard layer of cell 21, then the largest possible number of cells is that for which the magnetic field at cell 23 is just large enough to write the soft layer of that cell.

To implement a memory based on an array of storage cells, a scheme for addressing precisely one of a group of storage cells for writing is needed. The present invention utilizes one address scheme for writing a storage cell and a different address scheme for reading the storage cell. As noted above, data is written into a storage cell by exposing the storage cell to a magnetic field of sufficient strength to align the soft layers in a direction specified by the data to be stored. At the same time, the field generated on adjacent storage cells must be less than needed to alter the direction of polarization of the soft layers.

The magnetic field generated by a current flowing between electrodes 11 and 12 shown in FIG. 1 will set the magnetization either in a clockwise or counter clockwise direction if the current has sufficient magnitude. The direction of the resulting magnetization is determined by the direction of the current flow. However, such a writing scheme requires an addressing mechanism to assure that current flows only through the torroid that is to be written. In conventional memories, individual bits are addressed via a switching transistor that connects the desired bit to a bit line. Unfortunately, the current needed to write a torroid is too large to be accommodated by a conventional FET having dimensions consistent with a high density memory.

To avoid the need for switching transistors in series with the memory cells, the present invention generates the magnetic field used for writing by combining two magnetic fields to generate a magnetic field of sufficient strength to set the magnetization of the soft layers. Each of separate magnetic fields is insufficient in strength to alter the magnetization of the soft layers. However, the sum of the two fields has sufficient strength to flip the magnetization.

The first magnetic field is generated by passing a current through the torroid between electrodes 24 and 25 which are part of a bit line 27. The direction of this current determines the final direction in which the soft layers of the torroid are magnetized. The second magnetic field is generated by passing a current through a "word line" 26 which runs perpendicular to the axis of the torroid. The direction of the current in the word line is independent of the data being written in the torroid. For the purposes of this discussion, it will be assumed that the current flows into the plane of the figure. Only a torroid that is at the intersection of a bit line and a word line will be written.

Figure 3:
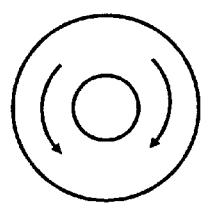
FIG. 3 is a top view of one of the soft layers in a memory cell illustrating the magnetic field generated by the current passing through a word line.

Refer now to FIG. 3 which is a top view of one of the soft layers in memory cell 20 illustrating the magnetic field generated by the current passing through word line 26. Word line 26 generates a magnetic field that is essentially parallel to the surface of the torroid. The resultant fields in the torroid are shown by the arrows in the figure. In effect, the field may be viewed as two fields pointing in the same direction.

Figure 4:
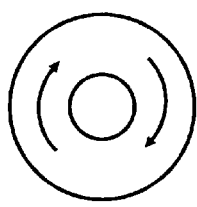
FIG. 4 illustrates the field generated by the current through the torroid when the current flows form the telectrode to bottom electrode.
Figure 5:
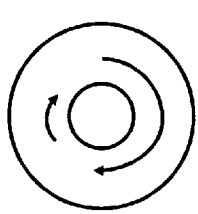
FIG. 5 illustrates the sum of the magnetic fields shown in FIGS. 3 and 4.
Figure 6:
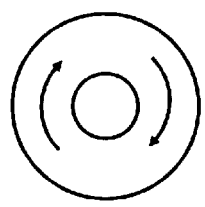
FIG. 6 illustrates magnetization resulting from the field shown in FIG. 5.

FIG. 4 illustrates the field generated by the current through the torroid when the current flows form electrode 24 to electrode 25. In effect, this field may be viewed as two fields pointing in opposite directions. The sum of the two fields is illustrated in FIG. 5. In effect, the field generated by the current is enforced by the field pointing in the same direction generated by the word line. As a result, the magnetization is switched to be as shown in FIG. 6. If the current between electrodes 24 and 25 were in the opposite direction, the final polarization would have been counter clockwise instead of clockwise.

Alternatively, the field generated by the word line can be viewed as weakening the existing magnetization. Once weakened, the remaining magnetization can be flipped by the field generated by the current passing through the torroid.

Figure 7:
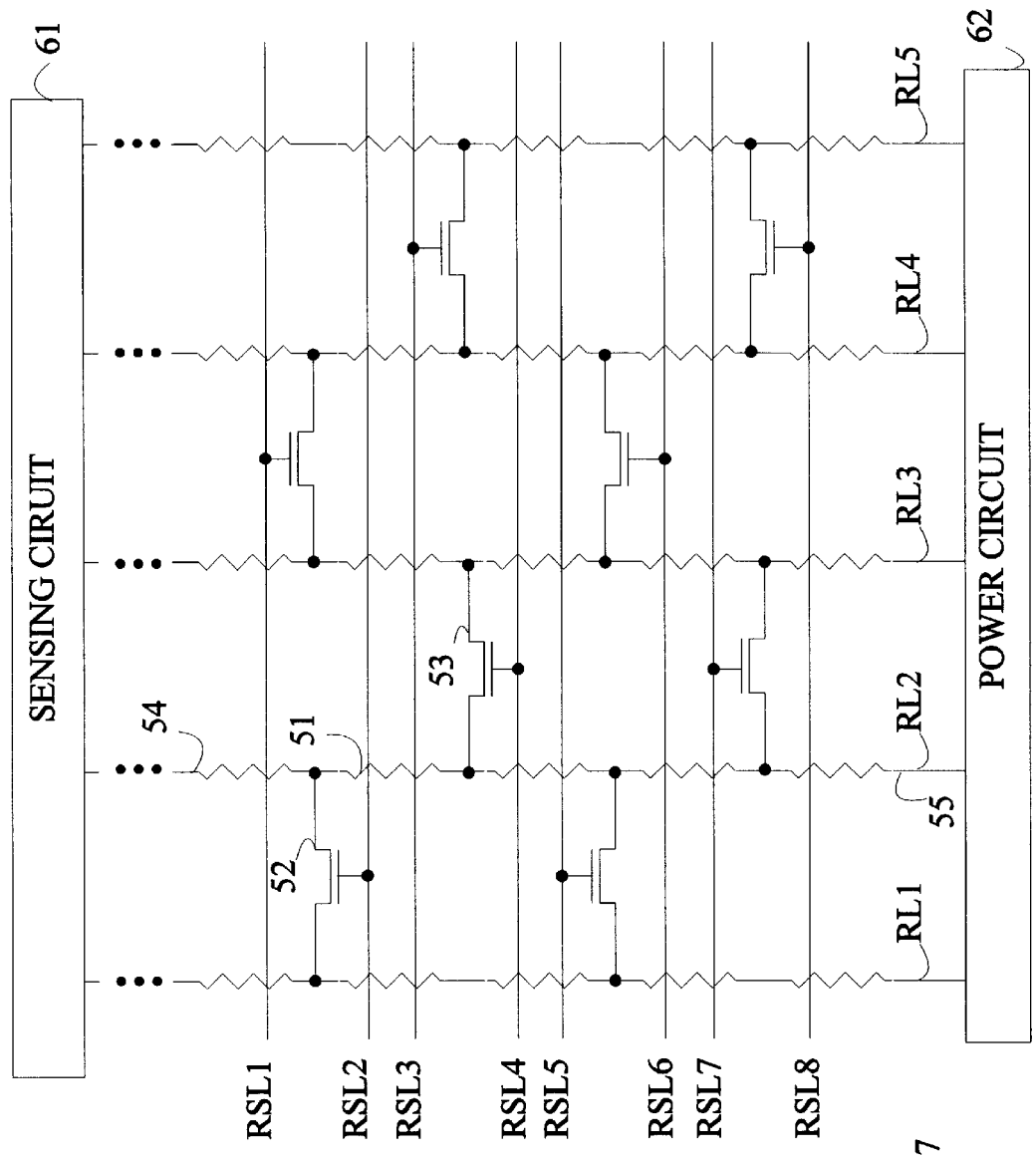
FIG. 7 is a schematic diagram of a portion of a memory according to the present invention as seen from the point of view of the read circuitry.

Refer now to FIG. 7 which is a schematic diagram of a portion of a memory 50 according to the present invention as seen from the point of view of the read circuitry. The memory elements are organized into a rectangular array of elements. Each of the memory elements appears to be a small resistor. An exemplary memory element is shown at 51. All of the elements in any given column are connected in series to form a read line having a node between each of the memory elements. For example, memory element 51 is connected to RL2.

It should be noted that the memory elements are symmetrical. That is, there is no distinction between the "top" and "bottom" electrodes. For notational convenience, the series connections will be described as if the top electrode of each memory element within a column is connected to the bottom electrode of the memory element closest to sensing circuit 61. The top electrode of the memory elements closest to sensing circuit 61 are connected to the sensing circuit. Similarly, the bottom electrode of each memory element within a column is connected to the top electrode of the adjacent memory element in the column that is closest to power circuit 62.

Each memory element may also be connected to the read lines on each side of its column with the aid of two transistors. For example, memory element 51 may be connected to RL1 and RL3 by placing signals of read select lines RS2 and RS4, respectively. The signal on RS2 places transistor 52 in a conducting state, and the signal on RS4 places transistor 53 in a conducting state.

As noted above, the resistances that must be sensed are quite small. Hence, a large current must be used to generate a significant voltage difference across the memory element. Sensing schemes in which the current must pass through an isolation transistor in series with the memory element are, hence, to be avoided, since the conductance of the transistor in the conducting state is still much greater than that of the resistance being sensed. The present invention avoids such arrangements.

The manner in which the data is sensed will now be explained with reference to memory element 51. To measure the resistance of memory element 51, transistors 52 and 53 are placed in a conducting state and RL1 and RL3 are connected to a very high impedance voltage sensing circuit. At the same time, a large current is passed through RL2 by connecting the ends shown at 54 and 55 to the appropriate voltage sources. Since RL1 and RL3 are essentially floating, the difference in voltage measured between RL1 and RL3 is the difference in voltage measured across memory element 51. Since no significant current flows through the transistors during the measurement process, the resistance of the transistors does not introduce problems in sensing the small resistances of the memory elements.

Accordingly, one end of each of the read lines terminates in a sensing circuit 61 which either connects that end to a voltage sensing circuit or to a power rail. The voltage sensing circuit measures the potential difference between that line and a second read line. The other end of each read line is connected to a power circuit which either connects that line to a second power rail or allows the line to float.

Figure 9:
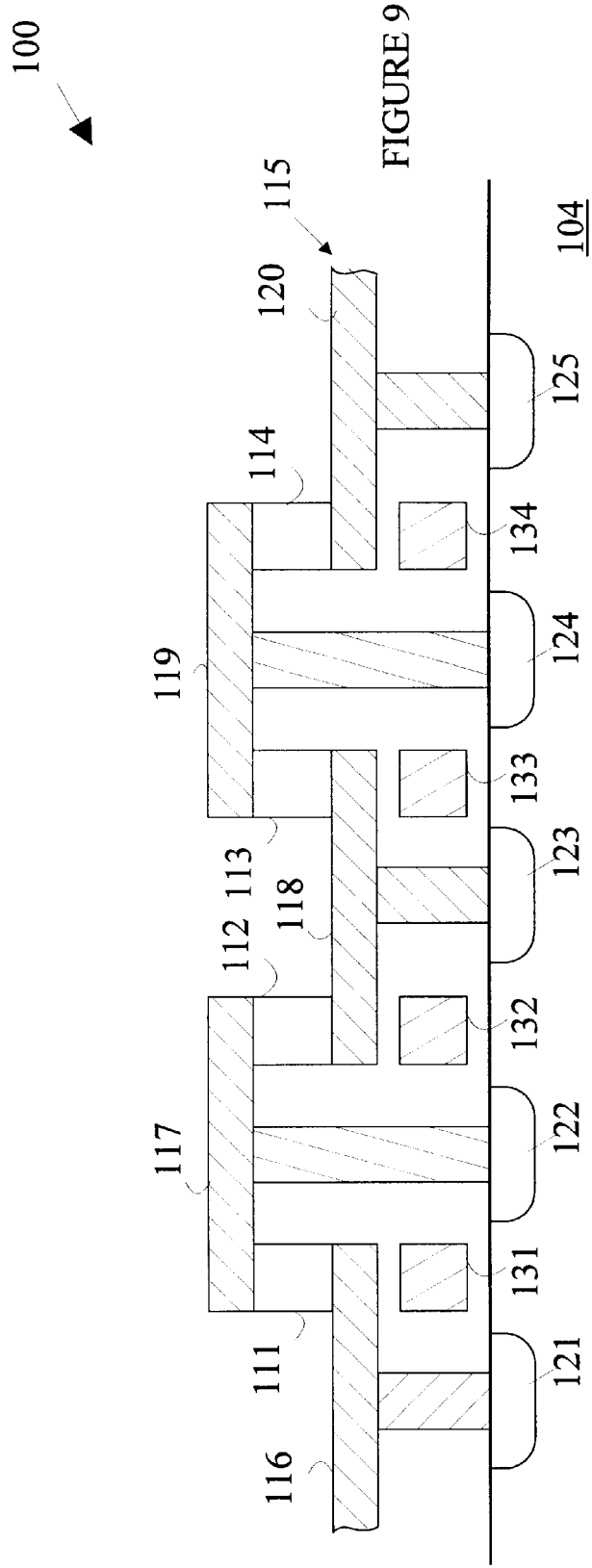
FIG. 9 is a cross-sectional view of the memory shown in FIG. 8 taken through line 101–102.
Figure 8:
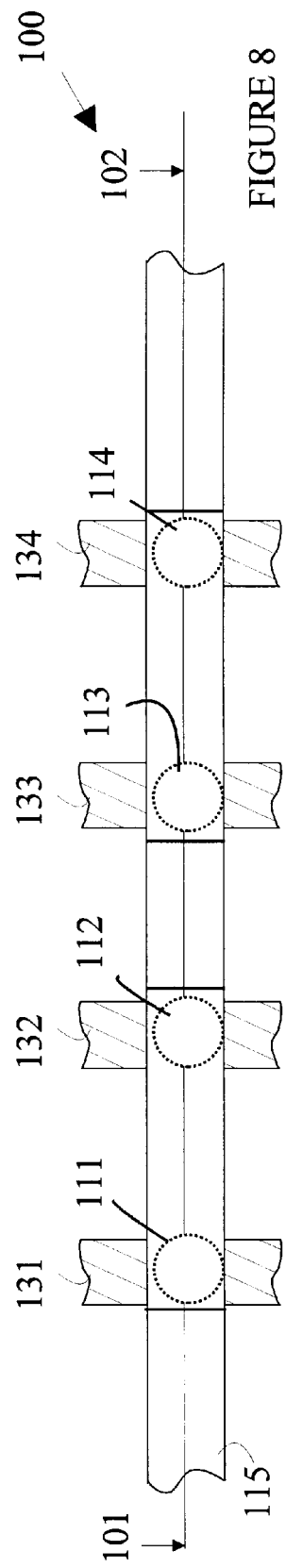
FIG. 8 is a top view of the portion of a memory connected to a read line and illustrating one possible placement of the write conductors.

The manner in which the read and write circuitry are combined to provide a memory according to the present invention may be more easily understood with reference to FIGS. 8 and 9. FIG. 8 is a top view of the portion of a memory 100 that is connected to a read line 115. FIG. 9 is a cross-sectional view of memory 100 taken through line 101–102 shown in FIG. 8. The portion of memory 100 shown in these figures includes 4 memory elements shown at 111–114. These elements are connected in series at nodes 116–120 along read line 115. Each node is connected to a transistor which is used to make connections to that node during read operations. The drain/source of the transistors connected to nodes 116–120 are shown at 121–125, respectively.

Data is written into memory elements 111–114 by combining the magnetic fields generated by passing a current through read line 115 and a corresponding one of write lines 131–134 which run at right angles to read line 115. For example, data is written into memory element 111 by passing currents through read line 115 and orthogonal write line 131. The direction of the current in read line 115 is used to set the data value.

Other arrangements of the write conductors with respect to the read line may also be practiced. For example, the write conductors can be moved to a location above the memory elements. Another configuration is shown in FIG. 10 which is a cross-sectional view of a portion of memory 100A. Memory 100A is essentially the same as memory 100 with the exception of the orthogonal write conductors which have been moved to a location above the read line 115 as shown at 131A–134A.

As discussed above, the differential resistance between the two directions of magnetization obtained with an individual three layer memory element as shown in FIG. 1 is relatively small. Accordingly, each memory element is preferably constructed by stacking as many of these three layer structures as possible. However, there is a limit to the number of such three-layered structures that can be placed in any single vertical stack.

There are two methods for extending the number of three-layered structures in each bit. The first involves utilizing write lines on both sides of the memory elements as shown in FIG. 11 which is a cross-sectional view of another embodiment of a memory according to the present invention. Memory 300 is essentially memory 100 with an additional set of auxiliary write conductors shown at 131B–134B. The write conductors are used in pairs to generate the word line fields. That is, currents flow through both write lines 131 and 131B when memory element 111 is written. The current directions are in opposite directions so that the fields generated add. The resultant field is more uniform across the memory element; hence, a larger memory element may be utilized. In addition, the magnitude of the current needed to generate the magnetic field in the memory elements is reduced by about a factor of two; hence, this embodiment requires less power during the writing operation.

Figure 12:
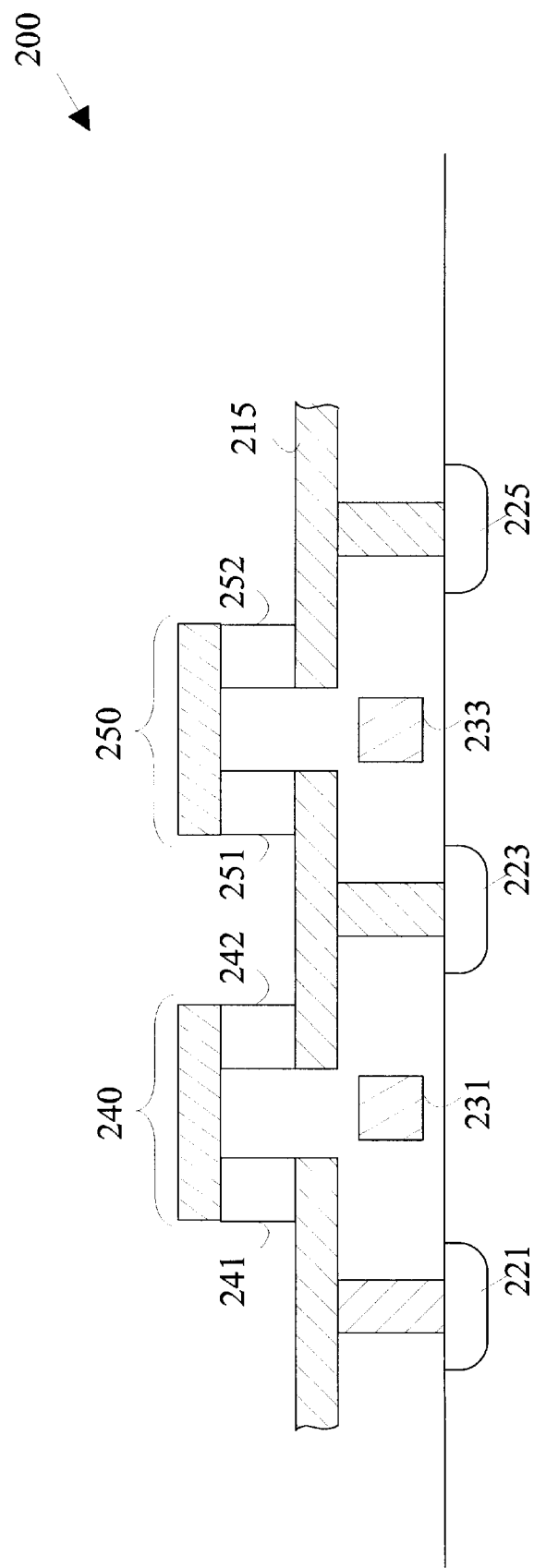
FIG. 12 is a cross-sectional view of a portion of a memory according to the present invention illustrating the manner in which the memory elements may be combined to provide a single bit memory cell having an increased difference in resistance between the two binary states.

A second method for increasing the effective number of layers in a stack is to utilize two stacks that are connected in series. Such an arrangement is shown in FIG. 12 which is a crosssectional view of a portion of a memory 200 along one read line 215. The portion shown in the figure has two one-bit cells shown at 240 and 250. Each one-bit cell is constructed from two memory elements which are connected in series. Memory cell 240 is constructed from memory elements 241 and 242, and memory cell 250 is constructed from memory elements 251 and 252.

Data is written into memory cell 240 by passing the appropriate currents through write line no line 235 in FIG. 12 and read line 215. Write line 231 is located such that the distance to each of the memory elements 241 and 242 is substantially the same. Similarly, data is written into memory cell 250 by passing the appropriate currents through write line 233 and read line 215. This arrangement effectively doubles the number of three layer structures that can be combined to provide a one bit memory cell. The advantages of the embodiments shown in FIGS. 11 and 12 may be combined by including a second set of write lines above the mirror memory cell in memory 200 to allow larger stacks of torroids to be utilized.

The above embodiments of the present invention have been described in terms of torroidal memory elements. However, the teachings of the present invention can also be applied to cylindrical memory elements, i.e., torroids without the hole in the center. While such elements are less stable than torroidal elements, memories can be constructed from such elements. Accordingly, the term torroid as used herein is defined to include the limiting case in which the torroid becomes a cylinder.

The above described embodiments have assumed that the data is written in the soft layers of the memory cell. In this case, the hard layers need only be magnetized once. In principle, this can be accomplished by increasing the fields used to write the soft layers to the point at which the hard layers are also written. Alternatively, the hard layers of the memory can be programmed in the presence of an external field which provides all or part of the field needed to magnetize the hard layers in the desired direction. For example, the memory can be placed in a strong magnetic field which has field lines parallel to surface of the individual memory elements. Such a field would be analogous to that generated by conductor 26 shown in FIG. 2. A programming current that generates a significantly smaller field is then applied on the bit line to force the magnetization into the desired direction (i.e., clockwise or counterclockwise).

The above described embodiments of the present invention have assumed that the data is written into the soft layer(s) of the memory cell. Embodiments in which the data is stored in the hard layer may also be constructed. In such systems, the write field must be strong enough to flip the magnetization of the hard layer(s). This field will also flip the magnetization of the soft layers. Hence, after writing, the hard and soft layers will have the same direction of magnetization. The memory cell is read by changing the direction of magnetization of the soft layer between the two possible directions for that layer and comparing the corresponding resistances of the memory cell. The direction of magnetization of the soft layer(s) is set by passing currents through the same write conductors used to write the hard layer(s). However, the magnitude of the currents is reduced to assure that only the direction of magnetization of the soft layer(s) is altered. It should be noted that the memory configurations described above may also be used with embodiments in which the data is stored in the hard layer(s).

One advantage of storing data in the hard layer(s) is that each memory cell can be referenced against itself in the reading operation, and hence, no external reference is needed. As noted above, the memory cell is read by comparing its resistance before and after the state of the soft layer is switched. In the preferred embodiment of the present invention, a sense amplifier is connected to the memory element being read. The sense amplifier is "zeroed" with the soft layer in a first state. That is, the amplifier is adjusted so that no current is flowing through the amplifier. The direction of the magnetization of the soft layer is then switched and the current through the sense amplifier measured.

It should be noted that the reading scheme shown in FIG. 7 is not needed in this self-referenced type of system. The preferred memory architecture is similar to that shown in FIG. 7 without the switching transistors utilized for connecting an element to the read lines on each side that element during the read operation. Instead, the sense amplifier is connected to the read line in which the memory element resides. Since all of the other elements in that read line remain unchanged when the soft layer of the element being read is switched, these other elements do not change the differential measured by the sense amplifier. The sense amplifier needs only to measure the difference in voltage or current at the end of the read line when the direction of magnetization of the soft layer in the element being measured is switched. Accordingly, this type of read/write scheme has the additional advantage of higher density of elements, since the switching transistors can be eliminated.

To minimize the complexity of the sense amplifier, it is advantageous to utilize a read scheme in which the direction of current through the sense amplifier does not change during the read cycle. Hence, the switching of the soft layer after the amplifier has been "zerroed" cannot involve a change in the direction of the current through the torroid element. In the preferred embodiment of the present invention, this is accomplished by using the word line current together with a current in through the torroid to set the soft layer to a first state. The first state is chosen such that the current through the torrid during the read operation in combination with a current through the word line will be sufficient to switch the soft layer magnetization to the opposite state. However, the read current without the aid of the word line current is insufficient to provide the switching.

Hence, the preferred read cycle operates as follows. First, the soft layer is set to the first state described above. This will involve utilizing a current that flows in a direction opposite to the direction of the read current; however, this is permitted before the actual reading begins. The read current is then applied to the read line associated with the memory element and the memory element is connected to the sense amplifier via the read line in which it resides as one of the series elements. The read current is then applied to memory element, and the sense amplifier is then zeroed. A current is then applied to the word line associated with the memory element being read. The direction of the current is chosen to create a second magnetic field of sufficient strength, when added to the field created by the read current through the element, to flip the magnetization of the soft layer. The current flowing through the sense amplifier is then measured to determine whether the resistance of the torroid element increased or decreased after the flip in magnetization of the soft layer.

The above description of the reading scheme referred to "zeroing" the sense amplifier current. However, it will be apparent to those skilled in the art that any method for storing the resistance of the memory element prior to the reversal of the magnetization of the soft layer may be used.

The above described embodiments of the present invention utilize a word line that generates a magnetic field that is more or less parallel to the surface of the torroids and which remains constant during the write cycle. However, other word line configurations may be utilized.

Figure 13:
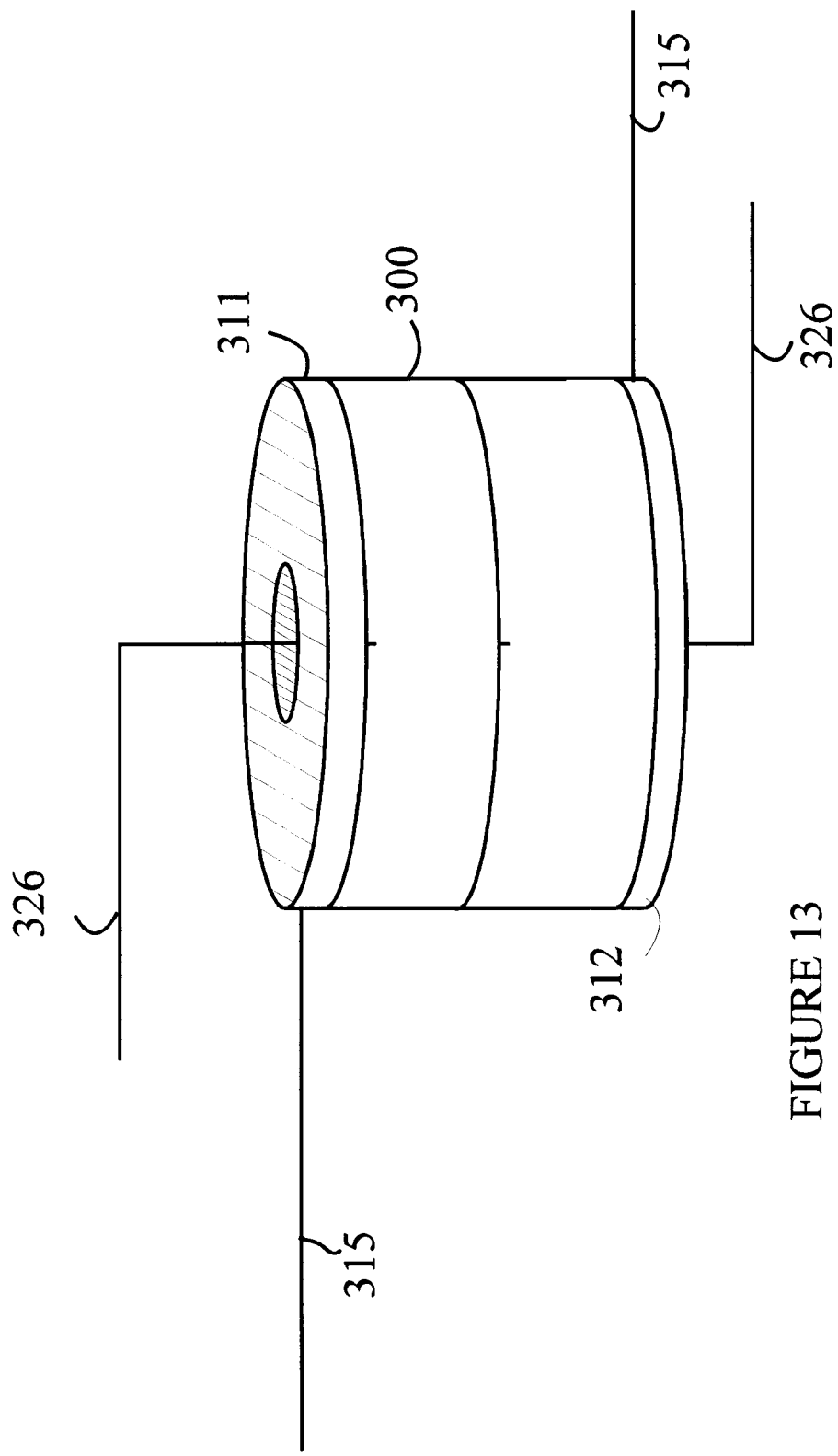
FIG. 13 is prospective view of a memory element 300 and the associated write conductors in an alternate embodiment of a memory cell according to the present invention.

Refer now to FIG. 13 which is prospective view of a memory element 300 and the associated write conductors in an alternate embodiment of a memory cell according to the present invention. The data to be written into memory element 300 is presented on a bit line 315 in a manner analogous to that described above. The current through bit line 315 determines the direction in which the data storage layer of memory element 300 will be programmed. The magnitude of the field generated by the bit line current, however, is insufficient to perform the programming without the aid of a second magnetic field which is generated by word line 326 which is parallel to the axis of the torroidal layers of memory element 300. Unlike the embodiments discussed above, word line 326 is pulsed during the write operation so that its current reversed direction during the write operation. Accordingly, the field generated by word line 326 will add to that generated by bit line 315 during one half of the write cycle and subtract from that generated by bit line 315 during the other half of the write cycle. During the half of the write cycle in which the fields add, the resultant field is sufficient to program the data storage layer of the memory element. In the half cycle in which the fields subtract, the resulting filed is too weak to program the memory element.

Various modifications to the present invention will become apparent to those skilled in the art from the foregoing description and accompanying drawings. Accordingly, the present invention is to be limited solely by the scope of the following claims.

What is claimed is:

1. A memory cell for storing information in the direction of magnetization of a layer of magnetic material, said memory cell comprising a memory element and a write circuit, said memory element comprising:

a top electrode;

a soft layer comprising a torroidal planar sheet of a soft magnetic material;

a hard layer comprising a torroidal planar sheet of a hard magnetic material, the magnitude to the magnetic field needed to magnetize said hard magnetic material being greater than the magnitude of the magnetic field needed to magnetize said soft magnetic material; and a bottom electrode, said soft and hard layers being sandwiched between said top and bottom electrodes; and a write circuit for causing a current to flow between said top and bottom electrodes is a direction determined by a data bit to be stored in a data storage layer, said data storage layer comprising either said hard layer or said soft layer, said current generating a first magnetic field in said data storage layer, and for generating a second magnetic field in said planar sheet of said data storage layer, the magnitude of said first and second magnetic fields being less than that needed to magnetize said data storage layer magnetic material and the magnitude of the vector sum of said first and second magnetic fields being greater than the magnetic field needed to magnetize said data storage layer magnetic material.

2. The memory cell of claim 1 wherein said data storage layer comprises said soft layer and wherein the magnitude of the vector sum of said first and second magnetic fields is less than that needed to magnetize said hard magnetic material.

3. The memory cell of claim 1 wherein said write circuit comprises a first conductor parallel to said planar sheet of said data storage layer, said first conductor generating said second magnetic field when a current is passed therethrough.

4. The memory cell of claim 3 wherein said write circuit further comprises a second conductor parallel to said first conductor, said memory element lying between said first and second conductors.

5. The memory cell of claim 1 further comprising a second memory element, said second memory element comprising:

a top electrode;

a soft layer comprising a torroidal planar sheet of a soft magnetic material;

a hard layer comprising a torroidal planar sheet of a hard magnetic material, the magnitude to the magnetic field needed to magnetize said hard magnetic material being greater than the magnitude of the magnetic field needed to magnetize said soft magnetic material, one of said hard or soft layers comprising a data storage layer; and a bottom electrode, said soft and hard layers being sandwiched between said top and bottom electrodes, said second memory element being connected in series with said first memory element such that said current flowing between said top and bottom electrodes of said first memory element also flows between said top and bottom electrodes of said second memory element, said second memory element being positioned such that the magnitude of said first and second magnetic fields are less than that needed to magnetize said data storage layer magnetic material and the magnitude of the vector sum of said first and second magnetic fields being greater than the magnetic field needed to magnetize said data storage magnetic material.

6. The memory cell of claim 7 wherein said write circuit generates substantially the same magnetic fields in said data storage layer of said first memory element and said data storage layer of said second memory element.

7. The memory cell of claim 1 wherein said write circuit comprises a word line conductor passing through said storage layer parallel to the axis of said torroidal layer, said second magnetic field being generated by passing a current through said conductor.

8. The memory cell of claim 7 wherein said write circuit generates a bi-polar pulse on said word line conductor.

9. The memory cell of claim 1 wherein said write circuit comprises a word line conductor perpendicular to the axis said torroidal layer of said storage layer, said second magnetic field being generated by passing a current through said conductor.

10. A memory system comprising a plurality of one bit memory cells, each of said one bit memory cells comprising:

a top electrode;

a soft layer comprising a torroidal planar sheet of a soft magnetic material;

a hard layer comprising a torroidal planar sheet of a hard magnetic material, the magnitude to the magnetic field needed to magnetize said hard magnetic material being greater than the magnitude of the magnetic field needed to magnetize said soft magnetic material; and a bottom electrode, said soft and hard layers being sandwiched between said top and bottom electrodes; and wherein, said one bit memory cells are arranged in a rectangular array having a plurality of rows and columns, and wherein said one bit memory cells in any given column are arranged in a linear order having a first memory cell, a last memory cell and one or more intermediate memory cells, said memory system further comprises a plurality of nodes, there being one such node between each two intermediate memory cells in each of said columns, said top and bottom electrodes of each of said intermediate memory cells being connected to said nodes, said top electrode of any given intermediate memory cell being connected to a different one of said nodes than said bottom electrode of that memory cell, thereby forming a series connected circuit of said intermediate memory cells; and a plurality of switching circuits for selectively connecting each of said nodes in each column to a node in a different column, there being one such switching circuit connected to each of said nodes.

11. The memory system of claim 10 further comprising a sensing circuit, connected to said top electrodes of said first memory cells in each of said columns, for measuring the potential difference between said top electrodes of said first memory cells.

12. The memory system of claim 10 further comprising a power circuit for causing a current to flow through said memory cells in a selected one of said columns.

13. The memory system of claim 10 further comprising:

a plurality of row write conductors, there being one such row write conductor corresponding to each of said rows in said memory system, each of said row write conductors being positioned with respect to said one bit memory cells in said corresponding row such that a current flowing through said row write conductor generates a first magnetic field in each of said one bit memory cells in said corresponding row; and a write circuit for causing a current to flow between said top and bottom electrodes of each one bit memory cell in one of said columns thereby generating a second magnetic field in each of said one bit memory cells in that column, the direction of said current flow specifying data to be written into one of said one bit memory cells in that column, the magnitude of said first and second magnetic fields being less than that needed to magnetize said soft magnetic material and the magnitude of the vector sum of said first and second magnetic fields being greater than the magnetic field needed to magnetize said soft magnetic material but less than the magnetic field needed to magnetize said hard magnetic material.

14. The memory system of claim 13 wherein said row write conductors are perpendicular to said columns.

15. The memory system of claim 13 further comprising a plurality of auxiliary row write conductors parallel to said row write conductors, there being one such auxiliary row write conductor for each row write conductor, each of said one bit memory cells lying between one of said auxiliary row write conductors and one of said row write conductors.

16. A method for reading a memory element comprising a top electrode;

a soft layer comprising a torroidal planar sheet of a soft magnetic material;

a hard layer comprising a torroidal planar sheet of a hard magnetic material, the magnitude to the magnetic field needed to magnetize said hard magnetic material being greater than the magnitude of the magnetic field needed to magnetize said soft magnetic material; and a bottom electrode, said soft and hard layers being sandwiched between said top and bottom electrodes to determine the direction of magnetization of said hard layer, said method comprising the steps of:

applying a magnetic field to said soft layer sufficient to magnetize said soft layer in a first direction, said magnetic field be less than that needed to change the direction of magnetization of said hard layer;

causing a current to flow in a second direction between said top and bottom electrodes;

connecting said top and bottom electrodes to a sense amplifier;

causing a current to flow through a write conductor associated with said memory element, said current having a direction and magnitude sufficient to cause the magnetization of said soft layer to reverse direction; and causing said sense amplifier to determine the difference in resistance between said top and bottom electrodes before and after said reversal of magnetization of said soft layer.

17. The method of claim 16 wherein said step of applying a magnetic field comprises causing a current to flow in a direction opposite to that of said second direction between said top and bottom electrodes while causing a current to flow through said write conductor.

* * * * *

UNITED STATES PATENT AND TRADEMARK OFFICE
CERTIFICATE OF CORRECTION

PATENT NO. : 5,923,583
DATED : July 13, 1999
INVENTOR(S) : Womack

Page 1 of 2

It is certified that error appears in the above-indentified patent and that said Letters Patent is hereby corrected as shown below:

Column 2, line 40; Replace "aerspective" with - - perspective- -

Column 2 line 40; Insert - - a - - before "perspective"

Column 2 line 43; Replace "sctures" with - -structures - -

Column 2 line 50, Replace "form" with - - from - -

Column 2 line 50,51; Delete "telectrode" at end of line 50 and beginning of line 51

Column 2, line 50; Insert - - top electrode - - at end of line

Column 2 line 66; Delete the line " – " between "an" and "alternative"

Column 5, line 4; Replace "form" with - - from - -

Column 7 line 4; Delete "crosssectional" before "view"

Column 7 line 4; Insert - - cross-sectional - - before "view"

Column 7 line 12; Delete "no line 235" after "write line" and Insert - - 231- -

Column 7 line 43; Insert - - the - - before "surface"

Column 8 line 16; Insert - - of - - between "side" and "that"

Column 8 line 37; Delete "in" between "current" and "through"

Column 8 line 52; Insert - - the - - between "to" and "memory"

Column 8 line 33; Replace "zerroed" with - - zeroed- -

UNITED STATES PATENT AND TRADEMARK OFFICE
CERTIFICATE OF CORRECTION

PATENT NO. : 5,923,583
DATED : July 13, 1999
INVENTOR(S) : Womack

It is certified that error appears in the above-indentified patent and that said Letters Patent is hereby corrected as shown below:

Column 9 line 29; Replace "filed" with - - field - - after "resulting"

Column 9 line 52; Replace "is" with - - in - - after "electrodes"

Column 10 line 48; Insert - - of - - at end of line after "axis"
Column 12 line 26; Replace "be" with - - being- - after "field"

Signed and Sealed this

Ninth Day of November, 1999

Attest:

Q. TODD DICKINSON

Attesting Officer

Acting Commissioner of Patents and Trademarks